United States Patent [19]

Alexander et al.

[11] Patent Number: 4,906,866
[45] Date of Patent: Mar. 6, 1990

[54] OUTPUT BUFFER FOR IMPROVING DI/DT

[75] Inventors: Samuel E. Alexander; Alan R. Bormann, both of Austin, Tex.

[73] Assignee: Motorola, Inc., Schaumburg, Ill.

[21] Appl. No.: 136,788

[22] Filed: Dec. 22, 1987

[51] Int. Cl.$^4$ .................. H03K 17/16; H03K 19/02; H03K 17/687

[52] U.S. Cl. .................................. 307/443; 307/446; 307/574

[58] Field of Search ............... 307/443, 448, 451, 446, 307/574

[56] References Cited

U.S. PATENT DOCUMENTS

| | | | |
|---|---|---|---|
| 4,678,943 | 7/1987 | Uragami et al. | 307/443 |
| 4,703,203 | 10/1987 | Gallup et al. | 307/473 |
| 4,725,982 | 2/1988 | Hara et al. | 307/473 |
| 4,730,126 | 3/1988 | Chen | 307/443 |

OTHER PUBLICATIONS

IBM Tech. Disc. Bul., vol. 16, No. 8, 1/74, Kraft et al.

Primary Examiner—Stanley D. Miller
Assistant Examiner—M. R. Wambach
Attorney, Agent, or Firm—James L. Clingan, Jr.

[57] ABSTRACT

An integrated circuit comprises a chip containing electric circuits in a package with leads. The chip receives power via the leads. The leads have inductance so that when there is a change in current flow (di/dt) through a lead there is a voltage which is developed between the end of the lead and the chip which can cause the chip to either malfunction or function poorly. The highest di/dt is generally caused by an output buffer that changes the logic state of its output. The typical output buffer has a pair of driver transistors that provide one of a logic high or logic low. The di/dt generated by these transistors is controlled by controlling the voltage on the gate or base of the transistor which is providing the particular logic state. This control is responsive to the magnitude of the power supply voltage. An impedance which varies in resistance with supply voltage is placed in series between the positive power supply terminal and the gate or base of the output transistors.

12 Claims, 2 Drawing Sheets

OUTPUT BUFFER FOR IMPROVING DI/DT

FIELD OF THE INVENTION

The present invention relates to buffers, and more particularly, to buffers which have inductance between a power source and the buffer.

BACKGROUND OF THE INVENTION

In integrated circuits, there is generally a piece of silicon known as a die or chip which contains electrical circuits and which is connected to a lead frame. The chip has bonding pads which are connected to the lead frame by tiny wires. The lead frame has leads which are used for connecting to a printed circuit board as part of a larger system. The leads of the lead frame have a certain amount of inductance as well as capacitance and resistance. There is also some inductance in the wire from the bonding pad to the lead frame. This wire inductance, however, is significantly less than that of the lead frame. The connection of a lead of the lead frame to a circuit board also adds some inductance. As the switching speeds of integrated circuits have increased, this cumulative inductance has begun to have an impact on the performance of the integrated circuit.

Of course it is desirable to have integrated circuits which are very fast. The increased switching speed has also increased the rate at which current changes. This increased rate of current change causes a voltage drop across the inductance. The voltage across an inductance is equal to the inductance times the time rate of change of the current through that inductance. This is expressed as $Ldi/dt$, where L is the inductance and $di/dt$ is the time rate of change of the current. As the $di/dt$ becomes larger, the voltage across the inductance becomes larger. This voltage drop across an inductance causes a voltage differential between the lead location on the circuit board and the bonding pad to which it is connected on the integrated circuit. This can create a problem of having the internal supply at different voltage than the voltage of the external supply.

This problem can be described by reference to FIG. 1 which shows a portion of an integrated circuit comprised of an output buffer 11, an internal positive power supply terminal VCCin connected to an external positive power supply terminal VCCex, an internal negative power supply terminal VSSin connected to an external negative power supply terminal VSSex, an internal output terminal Qin connected to an external output terminal Qex. Output buffer 11 receives power from its connections to VCCin and VSSin. In typical currently used integrated circuits, VCC is nominally 5 volts. Output buffer 11 provides an output on Qin. VCCin is an internal bonding pad on the chip portion of the integrated circuit. VCCex is the tip of one of the leads of the lead frame portion of integrated circuit 10. VSSin is an internal bonding pad on the chip portion of integrated circuit 10. VSSex is the tip of one of the leads of the lead frame portion of integrated circuit 10. Qin is an internal bonding pad on the chip portion of integrated circuit 10. Qex is the tip of one of the leads of the lead frame portion of integrated circuit 10. Inductances indicated as L1, L2, and L3 represent the inductances present by virtue of the connections between VCCin and VCCex, VSSin and VSSex, and Qin and Qex, respectively.

When output buffer 11 switches logic states, there will be a change in the current flowing into or out of output buffer 11 with respect to Qin. The amount of the current flowing will depend at least somewhat on a load which will be present on Qex. If the current changes so that more current is flowing to Qin, there will also be more current flowing from VCCin to output buffer 11 which in turn means that more current will be flowing between VCCex and VCCin. This change in current flow will cause a voltage drop between VCCin and VCCex by virtue of inductance L1. This voltage drop will be proportional to how rapidly the current changes between VCCin and VCCex. The expression for this voltage drop is $L1 di/dt$. The $L1 di/dt$ voltage drop is thus the difference between the power supply voltage which is present on the circuit board and the internal power supply which is used to drive the internal circuitry of integrated circuit 10. If this $L1 di/dt$ becomes sufficiently large, the logic state of other inputs to integrated circuit 10 can be misinterpreted. What the external circuit board interprets as a logic low may be interpreted as a logic high by integrated circuit 10 because the internal power supply voltage is so low. Although this differential between internal and external power supply voltage is only for the duration of the high rate of change of current, this can result in providing an erroneous output in an integrated circuit that is externally clocked or a significant delay in providing a valid output in an integrated circuit that is static.

The same type of situation can occur for the case in which output buffer 11 begins sinking current from Qin. In such case there will be a current change between output buffer 11 and VSSin which will also be present between VSSin and VSSex. The consequent change in current flow through L3 will cause a voltage drop between the internal VSSin and the external VSSex. This will have the effect of raising the voltage of the internal ground (VSS) above that of the circuit board ground. If this voltage differential becomes sufficiently large, then inputs to integrated circuit 10 may be misinterpreted. A signal which is a logic high with respect to the circuit board which is using VSSex as the ground reference, may be interpreted by integrated circuit 10 as a logic low because VSSex is too high of a voltage. This is in fact in general the more severe problem because in general a logic high is guaranteed as being recognized as a logic high when it is below one half of the power supply voltage. For example, in a typical 5-volt power supply MOS circuit, it is guaranteed that a signal will be recognized as a logic high even if it is only 2.0 volts. Such an input will then be more susceptible to making a false detection when there are fluctuations in an internal ground than when there are fluctuations in the internal 5-volt power supply terminal.

One conventional solution has been to keep the device sizes of the output buffer sufficiently low so that the output buffer does not cause too large of a current change. This of course is a sacrifice of speed. Another solution has been to add more power supply leads so that the current change is spread over more leads. More leads can be viewed as placing inductors in parallel which decreases the inductance. This adds to the cost of the package as well as requiring more space on the circuit board which uses the particular integrated circuit. Another approach has been to precharge the output to a logic low prior to valid data appearing on the output. This takes advantage of the more severe problem that occurs during a logic high to logic low transition. It is, however, generally desirable for the output to be high impedance (commonly known as tri-stated) when it is not valid. An example of this approach is shown in U.S. Pat. No. 4,661,928, Yasuoka.

The typical di/dt response to a typical logic state transition of a MOS type output is shown in FIG. 2. Shown in FIG. 2 is the logic low to logic high case. The transition begins at tim t0 and is complete at a time t1. The resulting change in current is shown as di/dt. A positive spike begins at time t0 when the current is increasing most rapidly. The rate of change of current falls off rapidly and becomes negative. The current is stabilized at time t1. The maximum height of the di/dt spike causes the maximum voltage differential between the internal power supply and the external power supply. Another solution is to provide a second pull-down device in the output buffer which is driven from an RC delayed signal so that there is somewhat of a stagger effect in changing the current flow. This results in two di/dt spikes so that the maximum spike height is lowered. This is an improvement but still not optimum. The problem has been most frequently seen in output buffers but internal buffers can have the same problem if there is a large current change. One example is the simultaneous precharging of the bit lines of a memory.

Shown in FIG. 3 is a desired shape of the time rate of change of the current drawn by a buffer, particularly for buffers which cause a large current change, such as an output buffer or a driver for precharging bit lines. To achieve a logic state change, there is some amount of charge which must be transferred. There is a steady state charge flow, or current, which must be sustained after the logic state has been changed. There is also capacitance which must be charged as part of the logic state change. Assuming that a logic state change is to be completed within the time from t0 to t1, the optimum di/dt curve is shown in FIG. 3. The rate of current change will be zero until time t0. At time t0, di/dt will reach a certain value and remain at that level until about half way through the logic state change. At that point the current needs to decrease to the steady state condition. This decrease should also occur at a constant rate until time t1. Although the negative portion of di/dt can potentially be as significant of a problem as the positive side, this is not generally the case. The nature of the circuitry generally causes slow changes as the steady state condition is approached. The nature of MOS transistors is such that when they are in the triode region, the current is proportional to the drain to source voltage. As the transistor that is charging an output node has its drain and source connected between a power supply terminal and the output node so that as the node becomes charged, the drain to source voltage decreases so that the current is reduced. There is thus in the nature of output transistors a relatively smooth di/dt reduction. Also the new logic state is actually reached before the steady state condition is reached. For example, a buffer ay provide a logic high at a steady state of 5 volts but a logic high is certain to be recognized when 4 volts is reached. In such case the rate at which the output moves from 4 volts to 5 volts is not significant. Consequently, the di/dt reduction is not generally a major consideration. The objective then is to reach the level at which a logic high is certain to be detected as fast as possible without causing a di/dt which is too great. A constant di/dt is thus the goal for at least the first half of the logic state transition. Improvements over the performance shown in FIG. 2 was disclosed in U.S. patent application Ser. No. 911,702, Dehganpour et al, filed Sept. 26, 1986, and U.S. patent application Ser. No. 081,194, Yu et al, filed Aug. 4, 1987, both assigned to the assignee hereof. The present invention is believed to offer advantages over the inventions disclosed in those applications.

SUMMARY OF THE INVENTION

An object of the present invention is to provide an improved output buffer.

Another object of the invention is to provide an output buffer with improved di/dt performance.

Yet another object of the invention is to provide an integrated circuit with improved output performance.

These and other objects are achieved in an integrated circuit comprising a chip containing electrical circuits contained in a package having leads, wherein a first lead is connected to a first power supply terminal of the chip, a second lead is connected to a second power supply terminal of the chip, and a third lead is connected to an output terminal of the chip, the first and second leads characterized as having inductance. A buffer circuit in the chip comprises a driver circuit, a first transistor, and an impedance circuit. The driver circuit, which has an input, passes current between the first power supply terminal and the output terminal in proportion to a voltage level present on the input in order to change a voltage level on said output terminal. The first transistor has a control electrode for receiving a data input signal, a first current electrode coupled to the input of the driver means, and a second current electrode. The impedance circuit provides a resistance between the second current electrode and the second current electrode of the first transistor which is proportional to the voltage on the second power supply terminal.

DESCRIPTION OF THE INVENTION

Figure 4:
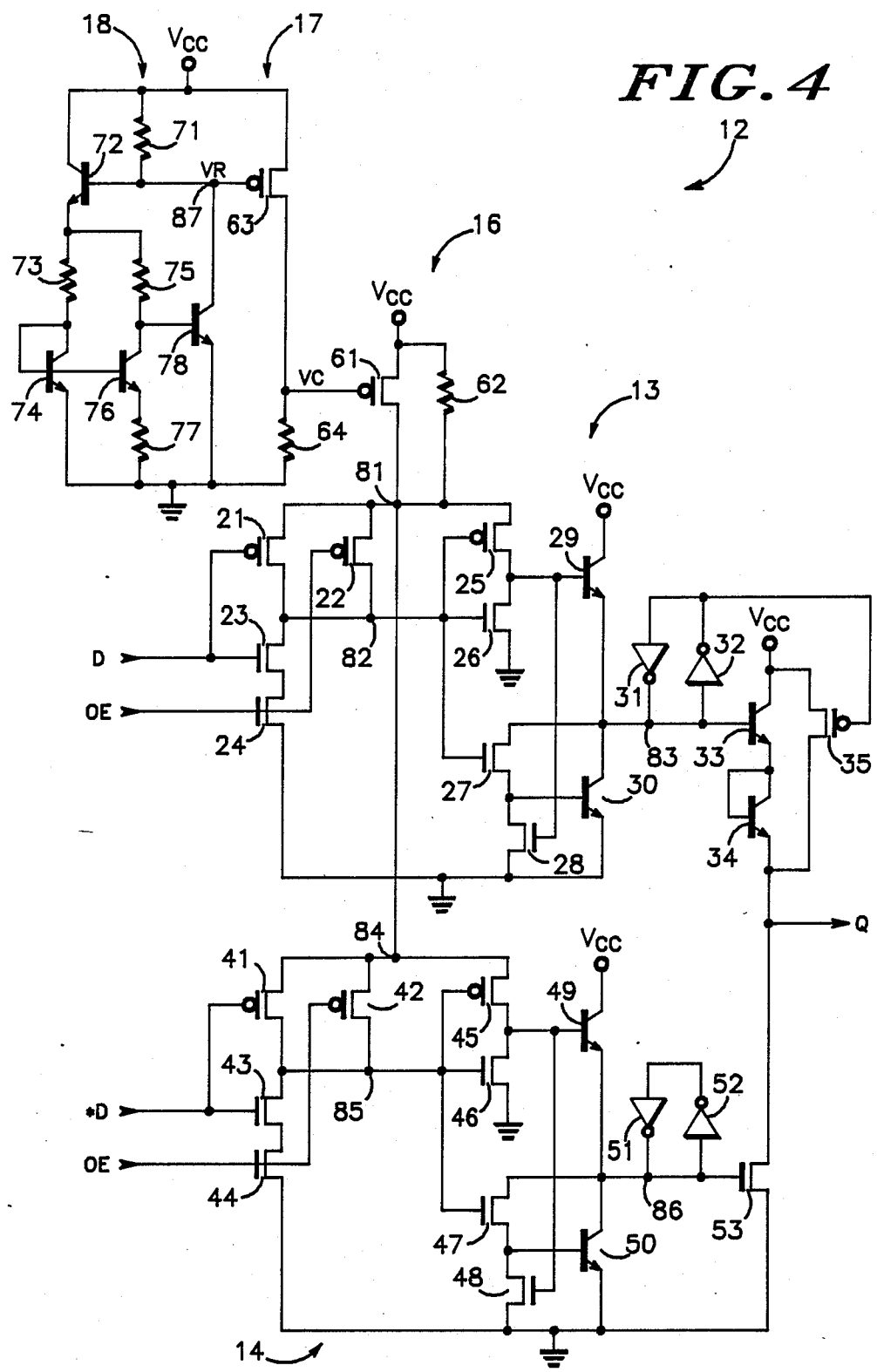
FIG. 4 is circuit diagram of an output buffer according to a preferred embodiment of the invention.

Shown in FIG. 4 is an output buffer 12 for use in providing an output signal of an integrated circuit comprised generally of a logic high driver 13, a logic low driver 14, a controllable impedance circuit 16, an impedance control circuit 17, and a reference circuit 18. Logic high driver circuit 13 comprises a P channel transistor 21, a P channel transistor 22, an N channel transistor 23, an N channel transistor 24, a P channel transistor 25, an N channel transistor 26, an N channel transistor 27, an N channel transistor 28, an NPN transistor 29, an NPN transistor 30, an inverter 31, an inverter 32, an NPN transistor 33, an NPN transistor 34, and a P channel transistor 35. Logic low driver 14 comprises a P channel transistor 41, a P channel transistor 42, an N channel transistor 43, an N channel transistor 44, a P channel transistor 45, an N channel transistor 46, an N channel transistor 47, an N channel transistor 48, an NPN transistor 49, an NPN transistor 50, an inverter 51, an inverter 52, and an N channel transistor 53. Controllable impedance 16 comprises a P channel transistor 61 and a resistor 62. Impedance control circuit 17 comprises a P channel transistor 63 and a resistor 64. Reference circuit 18 comprises a resistor 71, an NPN transistor 72, a resistor 73, an NPN transistor 74, a resistor 75, an NPN transistor 76, a resistor 77, and an NPN transistor 78.

Transistor 21 has a source connected to a node 81, a gate for receiving true data signal D, and a drain connected to a node 82. Transistor 22 has a source connected to node 81, a gate for receiving an output enable pulse OE, and a drain connected to node 82. Transistor 23 has a drain connected to node 82, a gate for receiving signal D, and a source. Transistor 24 has a drain connected to the source of transistor 23, a gate for receiving signal OE, and a source connected to ground. Transistor 25 has a source connected to node 81, a gate connected to node 82, and a drain. Transistor 26 has a drain connected to the drain of transistor 25, a gate connected to node 82, and a source connected to ground. Transistor 27 has a gate connected to node 82, a drain, and a source. Transistor 28 has a drain connected to the source of transistor 27, a gate connected to the drains of transistors 25 and 26, and a source connected to ground. Transistor 29 has a base connected to the drains of transistors 25 and 26, a collector connected to a positive power supply terminal VCC, and an emitter connected to a node 83. Transistor 30 has a collector connected to node 83, a base connected to the drain of transistor 28, and an emitter connected to ground. Inverter 32 has an input connected to node 83, and an output. Inverter 31 has an input connected to the output of inverter 32, and an output connected to node 83. Transistor 33 has a base connected to node 83, a collector connected to VCC, and an emitter. Transistor 34 has a base and a collector connected to the emitter of transistor 33, and an emitter for providing an output signal Q. Transistor 35 has a source connected to VCC, a gate connected to the output of inverter 32, and a drain connected to the emitter of transistor 34.

Transistor 41 has a source connected to a node 84, a gate for receiving a complementary data signal *D, and a drain connected to a node 85. Transistor 42 has a source connected to node 84, a gate for receiving signal OE, and a drain connected to node 85. Transistor 43 has a gate for receiving signal *D, a drain connected to node 85, and a source. Transistor 44 has a gate for receiving signal OE, a drain connected to the source of transistor 43, and a source connected to ground. Transistor 45 has a source connected to node 84, a gate connected to node 85, and a drain. Transistor 46 has a drain connected to the drain of transistor 45, a gate connected to node 85, and a source connected to ground. Transistor 47 has a drain connected to node 86, a gate connected to node 85, and a source. Transistor 48 has a drain connected to the source of transistor 47, a gate connected to the drains of transistors 45 and 46, and a source connected to ground. Transistor 49 has a base connected to the drains of transistors 45 and 46, a collector connected to VCC, and an emitter connected to node 86. Transistor 50 has a collector connected node 86, a base connected to the drain of transistor 48, and an emitter connected to ground. Inverter 52 has an input connected to node 86, and an output. Inverter 51 has an input connected to the output of inverter 52, and an output connected to node 86. Transistor 53 has a drain connected to the drain of transistor 35 and the emitter of transistor 34 for providing signal Q, a gate connected to node 86, and a source connected to ground.

Transistor 61 has a source connected to VCC, a gate for receiving a voltage control signal VC, and a drain connected to node 81 and to node 84. Resistor 62 has a first terminal connected to VCC, and a second terminal connected to node 81 and to node 84. Transistor 63 has a source connected to VCC, a drain connected to the gate of transistor 61 for providing signal Vc, and a gate connected to a node 87 for receiving a voltage reference VR. Resistor 71 has a first terminal connected to VCC, and a second terminal connected to node 87. Transistor 72 has a base connected to node 87, a collector connected to VCC, and an emitter. Resistor 73 has a first terminal connected to the emitter of transistor 72, and a second terminal. Transistor 74 has a collector and a base connected to the second terminal of resistor 73, and an emitter connected to ground. Resistor 75 has a first terminal connected to the emitter of transistor 72, and a second terminal. Transistor 76 has a collector connected to the second terminal of resistor 75, a base connected to the base of transistor 74, and an emitter. Resistor 77 has a first terminal connected to the emitter of transistor 76, and a second terminal connected to ground. Transistor 78 has a base connected to the collector of transistor 76, a collector connected to node 87, and an emitter connected to ground.

The voltage at VCC in typical integrated circuits is specified to be between 4.5 and 5.5 volts. The di/dt problem is more severe at 5.5 volts than at 4.5 volts. In a typical approach to ensuring that the di/dt generated noise is not above some magnitude known to be tolerable, the output buffer is designed to be sufficiently slow for the worst case di/dt which is the high power supply voltage situation. This is rational because the circuit must be able to handle the worst case condition. The problem then is that circuit speed is further reduced for the low power supply situation, i.e., the speed of the output buffer is reduced below what is necessary to avoid the tolerable di/dt level. Output buffer 12 includes di/dt compensation which reduces di/dt sufficiently at the high power supply voltage but has a reduced effect at the low power supply voltage.

In general, buffer 12 provides signal Q at a logic high or a logic low according to the logic state of signals D and *D when signal OE is a logic high. When signal OE is a logic low, signal Q is at a high impedance which is commonly known as tri-stated. Nodes 81 and 84 are power supply nodes which have di/dt compensation. Transistors 21-24 and transistors 41—44 comprises conventional NAND gates except for the power supply having di/dt compensation. Similarly transistors 25-26 and 45-46 form conventional inverters but for the power supply having di/dt compensation. Transistors 29 and 30 provide a push-pull driver for transistor 33. Similarly, transistors 49 and 50 provide a push-pull driver for transistor 53. The drive provided by transistor 29 to transistor 33 is current gain. The voltage on node 83 will track the voltage on the base of transistor 29. There will be a quite constant base-emitter (Vbe) drop between the base of transistor 29 and node 83 when transistor 29 is driving node 83. The case when transistor 29 is driving node 83 is the typical case when there is a di/dt problem. When transistor 30 is pulling down node 83, transistor 33 is generally not supplying much, if any, current so there is normally little di/dt concern for transistor 33 in that case. There is a situation which can occur and which can present a problem for node 83 being switched to a logic low. If node 83 has just switched to a logic high so that transistor 33 is conducting maximum current and then node 83 is switched to a logic low so that transistor 33 is quickly made non-conductive, then there would be a sudden stop in current flow which would cause a large di/dt noise spike. This can occur because output enable signal OE can occur anytime to turn off whichever of transistors 33 and 53 is conductive. This adverse di/dt is controlled by controlling node 82 for a logic low to logic high transition thereof. This control is accomplished by having the power supply terminal of the NAND gate formed of transistors 21-24 connected to node 81 which has di/dt compensation. Similarly for logic low driver 14, node 86 tracks the voltage on the base of transistor 49 for the case when node 86 is being driven to a logic high. Node 85 is controlled in the same manner as node 82 for the case in which signal OE disables output driver circuits 13 and 14 while one of transistors 33 and 53 is conducting maximum current. The bases of transistors 29 and 49 are controlled by the inverters formed of transistors 25-26 and 45-46 having the power supply terminal thereof connected to a controlled power supply node.

Figure 1:
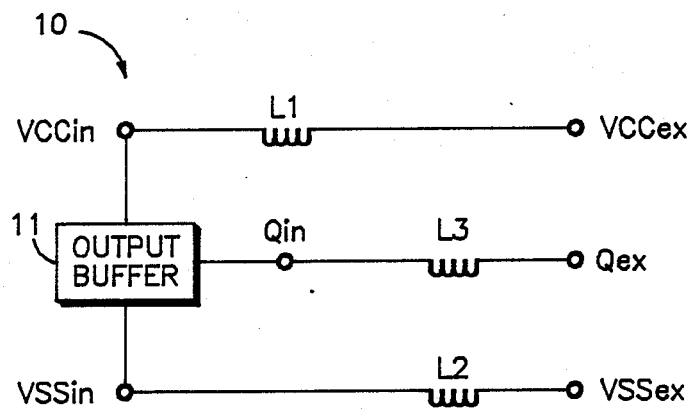
FIG. 1 is a combination circuit diagram and block diagram of a portion of an integrated circuit according to the prior art.
Figure 2:
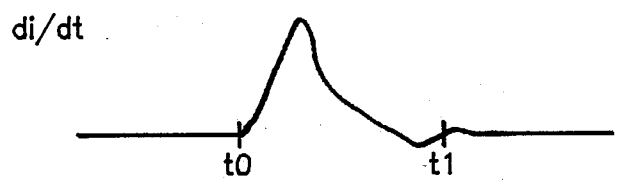
FIG. 2 is a diagram of a typical shape of time rate of change of current supplied by a buffer of the prior art.
Figure 3:
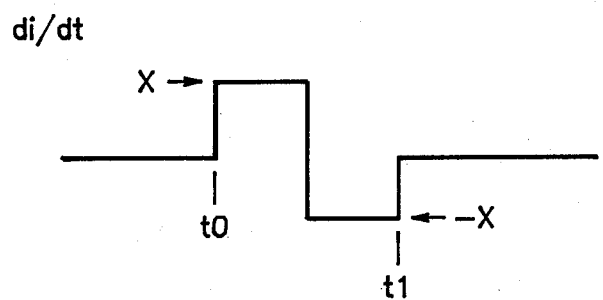
FIG. 3 is a diagram of a desired shape of time rate of change of current supplied by a buffer.

For the case in which node 82 is pulled to a logic low by data signal D switching to a logic high, transistor 25 becomes conductive and begins driving current into the base of transistor 29 which in turn drives current into node 83 and the base of transistor 33. Signal Q begins rising in voltage and tracks the base of transistor 29 and node 83. The current through transistor 25 drives into the base of transistor 29 so that the control of current through transistor 25 results in the control of current through transistor 33. The current through transistor 25 is controlled by the impedance between Vcc and node 81. This impedance between node 81 and Vcc is controllable impedance 16 which is controlled by impedance controller 17 and reference circuit 18. Reference circuit 18 is a conventional band-gap reference. In the buffer of FIG. 1, reference VR is set to 3.0 volts above ground. The impedance of transistor 63 is then inversely proportional to the voltage of VCC. As Vcc gets larger, transistor 63 becomes more conductive because the gate to source differential becomes greater. As transistor 63 becomes more conductive, control signal Vc becomes larger. Signal Vc is at nearly ground potential for the case when VCC is at a 4.5 volts and at about 4.5 volts when VCC is at 5.5 volts. Thus transistor 61 is highly conductive when VCC is at 4.5 volts and virtually non-conductive when VCC is at 5.5 volts. Because transistor 61 and resistor 62 are in parallel, the maximum resistance between VCC and node 81 is the resistance of resistor 62. Transistor 61 reduces the resistance between VCC and node 81 as VCC drops lower. The lowest resistance between VCC and node 81 is determined primarily by the high conductivity state of transistor 61.

Having resistance in series with the P channel drive transistors, such as transistors 25 and 45, has been found to provide better di/dt compensation than merely reducing the gain of the P channel transistor. A greater magnitude of series resistance results in greater reduction in di/dt noise but also a results in making the transition of the output signal, such as signal Q, slower. The di/dt compensation for buffer 12 increases the series resistance as the di/dt noise would tend to get worse. As supply voltage increases, output buffers naturally get faster and thus generate greater di/dt noise. Reference 18, controller 17, and impedance 16 operate to increase the resistance in series with transistor 25 as the voltage at VCC increases and to decrease this resistance as the voltage at VCC decreases. This results in reducing the variation in di/dt noise with variation in power supply voltage. Thus, the buffer can be designed so that there is very little variation in speed with power supply variation. The fastest transition of the output signal is limited by di/dt noise but the subsequent deterioration in speed for a lower VCC is reduced because the di/dt compensation is reduced as power supply voltage is reduced.

There is also some compensation for temperature. Lower temperature results in higher speed and thus more di/dt noise. Signal Vc will increase in voltage as temperature decreases so that the impedance between VCC and node 81 increases. The impedance between VCC and node 81 thus changes with temperature so as to provide di/dt noise compensation.

Controllable impedance 16 is also connected to node 84. For a given output state, only one of transistors 25 and 45 will be conductive. For the case in which transistor 45 is conductive, the impedance between VCC and node 84 is controlled in the same way as between VCC and node 81 to provide di/dt compensation. Node 85 is compensated via transistors 42 and 41 for the logic low to logic high transition thereof. Node 85 at a logic high causes transistor 47 to become conductive which couples node 86 to the base of transistor 50. If node 86 was a logic high, then transistor would couple current to the base of transistor 50 which would then rapidly discharge node 86. Inverters 51 and 52 form a latch which would flip states as node 86 is pulled below the trip point of this latch. Node 86 would thus be discharged all the way to ground by the latch. Transistor 48 is held non-conductive by the inverter formed of transistors 45-46. When node 85 switches to a logic low, the transistors 45-46 inverter outputs a logic high to transistor 48 to hold the base of transistor 50 to ground. Transistors 27 and 28 and the latch formed of inverters 31 and 32 operate analogously to transistors 47 and 48 and the latch formed of inverters 51 and 52. Additionally, Inverter 32 causes transistor 35 to be conductive when transistor 33 is made conductive by node 83 being a logic high. Transistor 35 drives the output signal Q all the way to VCC. Transistor 34 protects transistor 33 from excessive reverse bias of its base-emitter. There are well known shallow junction effects which result in damage to an NPN transistor if its base-emitter is excessively reverse biased. This damage can occur typically at about 3.5 volts of reverse bias. This amount of reverse bias could occur, if transistor 34 were not there, for the case when buffer 12 was tri-stated.

Thus, it will be apparent to those skilled in the art that the disclosed invention may be modified in numerous ways and may assume many embodiments other than those specifically set out and described above. For example, an impedance could be placed in series with impedance controller 16 which would ensure a certain minimum resistance. Impedance controller 16 could serve other buffers such as buffer 12. There could be a separate impedance controller for logic high driver 14 and logic low driver 13. Transistors 21, 22, 41, and 42 could be connected directly to VCC instead of through impedance controller 16. Accordingly, it is intended by the appended claims to cover all modifications of the invention which fall within the true spirit and scope of the invention.

We claim:

1. A buffer circuit, comprising:

driver means, coupled to an output terminal and having an input, for passing current between a first power supply terminal and the output terminal in proportion to a voltage level on said input in order to change a voltage level on said output terminal;

a first resistor having a first terminal coupled to the first power supply terminal, and a second terminal;

a first transistor having a first current electrode coupled to the input of the driver means, a second current electrode coupled to the second terminal of the first resistor, and a control electrode for receiving an input signal; and impedance means, coupled to the first resistor, for providing a resistance in parallel with the first resistor which is proportional to the voltage on the first power supply terminal; wherein said impedance means comprises a reference voltage generator for generating a reference voltage;

controller means, coupled to the reference voltage generator, for generating a control signal at a voltage proportional to the voltage at the first power supply terminal; wherein said impedance means comprises a second transistor having a control electrode for receiving the control signal, a first current electrode coupled to the second power supply terminal, and a second current electrode coupled between the first transistor and the first resistor.

2. The buffer circuit of claim 1, wherein the driver means comprises:

a third transistor having a control electrode as the input of the driver means, a first current electrode coupled to the first power supply terminal, and a second current electrode; and a fourth transistor having a control electrode coupled to the second current electrode of the third transistor, a first current electrode coupled to the output terminal, and a second current electrode coupled to the first power supply terminal.

3. A buffer circuit comprising:

a first driver means, coupled to an output terminal and having an input, for passing current between a first power supply terminal and the output terminal in proportion to a voltage level on said input in order to change a voltage level on said output terminal;

a first transistor having a control electrode for receiving a first data input signal, a first current electrode coupled to the input of the first driver means, and a second current electrode;

impedance control means for providing a control signal at a voltage which is proportional to the voltage at a second power supply terminal; and impedance means, coupled between the second current electrode of the first transistor and the second power supply terminal and coupled to the impedance control means, for receiving the control signal and for providing a resistance between the second power supply terminal and the second current electrode of the first transistor which is proportional to the voltage of the control signal;

second driver means, coupled to the output terminal and having an input, for passing current between the second power supply terminal and the output terminal in proportion to a voltage level on said input in order to change the voltage level on said output terminal; and a second transistor having a control electrode for receiving a second data input signal, a first current electrode coupled to the input of the second driver means, and a second current electrode coupled to the second current electrode of the first transistor.

4. A buffer circuit, comprising:

a first driver means, coupled terminal and having an input, for passing current between a first power supply terminal and the output terminal in proportion to a voltage level on said input in order to change a voltage level on said output terminal;

a first transistor having a control electrode for receiving a first data input signal, a first current electrode coupled to the input of the first driver means, and a second current electrode;

impedance control means for providing a control signal at a voltage which is proportional to the voltage at a second power supply terminal; and impedance means, coupled between the second current electrode of the first transistor and the second power supply terminal and coupled to the impedance control means, for receiving the control signal and for providing a resistance between the second power supply terminal and the second current electrode of the first transistor which is proportional to the voltage of the control signal;

wherein the impedance control means comprises:

a reference generator for generating a reference voltage at a predetermined voltage;

a second transistor having a first current electrode coupled to the second power supply terminal, a control electrode for receiving the reference voltage, and a second current electrode for providing the control signal; and a first resistor having a first terminal coupled to the second current electrode of the second transistor, and a second terminal coupled to the first power supply terminal.

5. A buffer circuit, comprising:

a first driver means, coupled to an output terminal and having an input, for passing current between a first power supply terminal and the output terminal in proportion to a voltage level on said input in order to change a voltage level on said output terminal;

a first transistor having a control electrode for receiving a first data input signal, a first current electrode coupled to the input of the first driver means, and a second current electrode;

impedance control means for providing a control signal at a voltage which is proportional to the voltage at a second power supply terminal; and impedance means, coupled between the second current electrode of the first transistor and the second power supply terminal and coupled to the impedance control means, for receiving the control signal and for providing a resistance between the second power supply terminal and the second current electrode of the first transistor which is proportional to the voltage of the control signal;

wherein the first driver means comprises:

a second transistor having a first current electrode coupled to the output terminal, a second current electrode coupled to the first power supply terminal, and a control electrode; and a third transistor having a first current electrode coupled to the control electrode of the second transistor, a second current electrode coupled to the second power supply terminal, and a control electrode coupled to the first current electrode of the first transistor.

6. The buffer of claim 5 further comprising:

second driver means, coupled to the output terminal and having an input, for passing current between the second power supply terminal and the output terminal in proportion to a voltage level on said input in order to change the voltage level on said output terminal; and a fourth transistor having a control electrode for receiving a second data input signal, a first current electrode coupled to the input of the second driver means, and a second current electrode coupled to the second current electrode of the first transistor.

7. The buffer circuit of claim 6 wherein the second driver means comprises:

a fifth transistor having a first current electrode coupled to the output terminal, a second current electrode coupled to the second power supply terminal, and a control electrode; and a sixth transistor having a first current electrode coupled to the control electrode of the fifth transistor, a second current electrode coupled to the second power supply terminal, and a control electrode coupled to the first current electrode of the fourth transistor.

8. The buffer of circuit of claim 7 wherein the first transistor is a P channel transistor, the second transistor is an NPN transistor, the third transistor is an N channel transistor, the fourth transistor is a P channel transistor, the fifth transistor is an NPN transistor, and the sixth transistor is an NPN transistor.

9. In an integrated circuit comprising a chip containing electrical circuits contained in a package having leads, wherein a first lead is connected to a first power supply terminal of the chip, a second lead is connected to a second power supply terminal of the chip, and a third lead is connected to an output terminal of the chip, the first and second leads characterized as having inductance, a buffer circuit in the chip, comprising:

a first logic gate having a first power terminal coupled to the first power supply terminal, a second power terminal coupled to a controlled node, a first data input for receiving a true data signal, a second data input for receiving an output enable signal, and an output;

a second logic gate having a first power terminal coupled to the first power supply terminal, a second power terminal coupled to the controlled node, a first data input for receiving a complementary data signal, a second data input for receiving the output enable signal, and an output;

a first inverter having a first power terminal coupled to the first power supply terminal, a second power terminal coupled to the controlled node, an input coupled to the output of the first logic gate, and an output;

a second inverter having a first power terminal coupled to the first power supply terminal, a second power terminal coupled to the controlled node, an input coupled to the output of the second logic gate, and an output;

first driver means having an input coupled to the output of the first inverter and an output coupled to the output terminal for passing current between the first power supply terminal and the output terminal in response to the output of the first inverter;

second driver means having an input coupled to the output of the second inverter and an output coupled to the output terminal for passing current between the second power supply terminal and the output terminal in response to the output of the first inverter;

impedance control means for providing a control signal at a voltage which is proportional to the voltage at the second power supply terminal; and impedance means, coupled to the impedance control means, for providing a resistance between the controlled node and the second power supply terminal which is inversely proportional to the voltage of the control signal.

10. The output buffer of claim 9 wherein the impedance control means comprises:

a reference generator for a generating a reference voltage at a predetermined voltage;

a first transistor having a first current electrode coupled to the second power supply terminal, a control electrode for receiving the reference voltage, and a second current electrode for providing the control signal; and a first resistor having a first terminal coupled to the second current electrode of the first transistor, and a second terminal coupled to the first power supply terminal.

11. The output buffer of claim 10 wherein the impedance means comprises a second transistor having a control electrode for receiving the control signal, a first current electrode coupled to the second power supply terminal, and a second current electrode coupled to the controlled node.

12. The output buffer of claim 11 wherein the impedance means further comprises a second resistor having a first terminal coupled to the second power supply terminal, and a second terminal coupled to the controlled node.

* * * * *

UNITED STATES PATENT AND TRADEMARK OFFICE
CERTIFICATE OF CORRECTION

PATENT NO. : 4,906,866
DATED : March 06, 1990
INVENTOR(S) : Samuel E. Alexander and Alan R. Bormann It is certified that error appears in the above-identified patent and that said Letters Patent is hereby corrected as shown below:

Column 10, line 7, insert --to an output-- after "coupled".

Column 11, line 8, change "proportional" to --proportion--.

Signed and Sealed this

Second Day of July, 1991

Attest:

HARRY F. MANBECK, JR.

Attesting Officer

Commissioner of Patents and Trademarks